United States Patent [19]

Nakazawa

[11] Patent Number: 4,797,625
[45] Date of Patent: Jan. 10, 1989

[54] DEVICE FOR DETECTING BIT PHASE DIFFERENCE

[75] Inventor: Satoshi Nakazawa, Tokyo, Japan

[73] Assignee: NEC Corporation, Japan

[21] Appl. No.: 99,540

[22] Filed: Sep. 22, 1987

[30] Foreign Application Priority Data

Sep. 25, 1986 [JP] Japan ............................... 61-226670
Jan. 14, 1987 [JP] Japan ................................. 62-7815

[51] Int. Cl.$^4$ ...................... H03K 9/06; H03D 13/00
[52] U.S. Cl. ...................................... 328/133; 328/55;
328/155; 307/511; 307/471; 307/479
[58] Field of Search ............... 307/471, 479, 511, 262,
307/243, 514, 516; 328/55, 133, 155, 134, 104;
377/78; 375/118–120, 111; 371/48, 49, 67, 68;
340/146.2

[56] References Cited

U.S. PATENT DOCUMENTS 4,426,620  1/1984  Buchenauer ................... 307/511 X
4,700,347 10/1987  Rettberg et al. .................. 328/55 X Primary Examiner—Stanley D. Miller
Assistant Examiner—Timothy P. Callahan
Attorney, Agent, or Firm—Ostrolenk, Faber, Gerb & Soffen

[57] ABSTRACT

A bit phase difference detecting device applicable to, for example, a digital microwave communications system for channel switching. The device detects a difference in phase difference between two identical data sequences each being transmitted over a respective one of two independent transmission paths. Each of the data sequences is serial-to-parallel converted into bit sequences, the number of which is equal to a predetermined common measure of the frame period of the data sequences. Comparators and decision circuits associated one-to-one with the comparators are provided for individually detecting differences in bit phase between those bit sequences derived from one data sequence and those derived from the other data sequence which correspond to each other with respect to order.

6 Claims, 6 Drawing Sheets

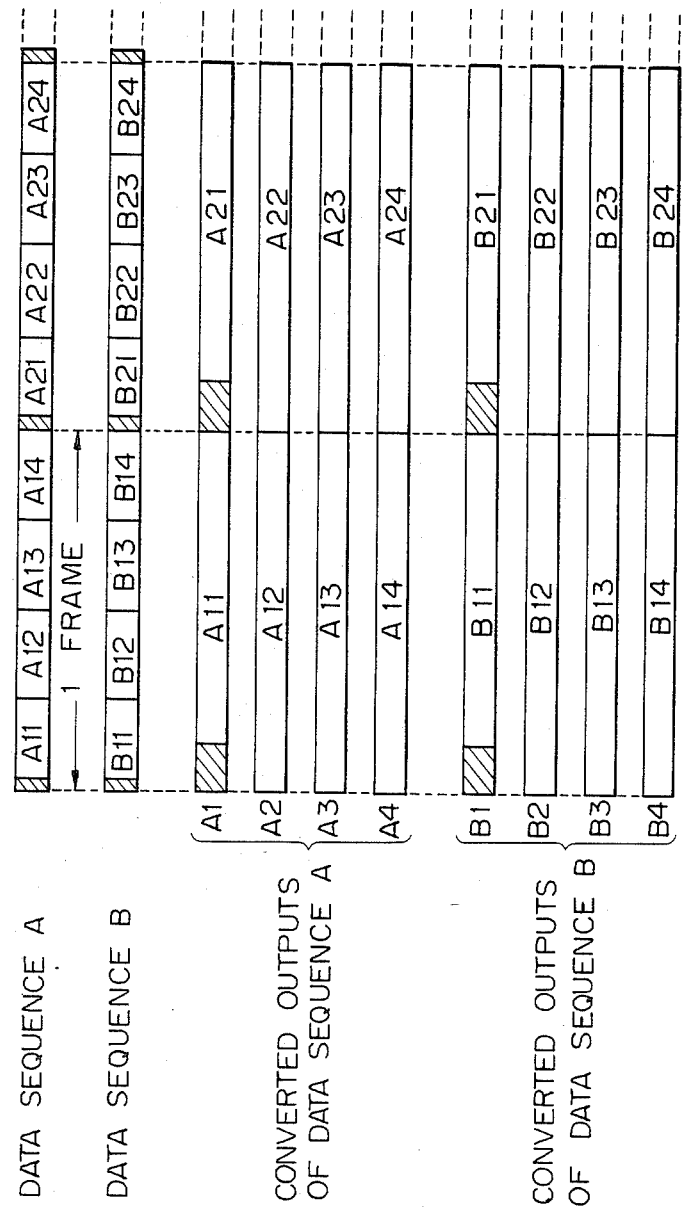

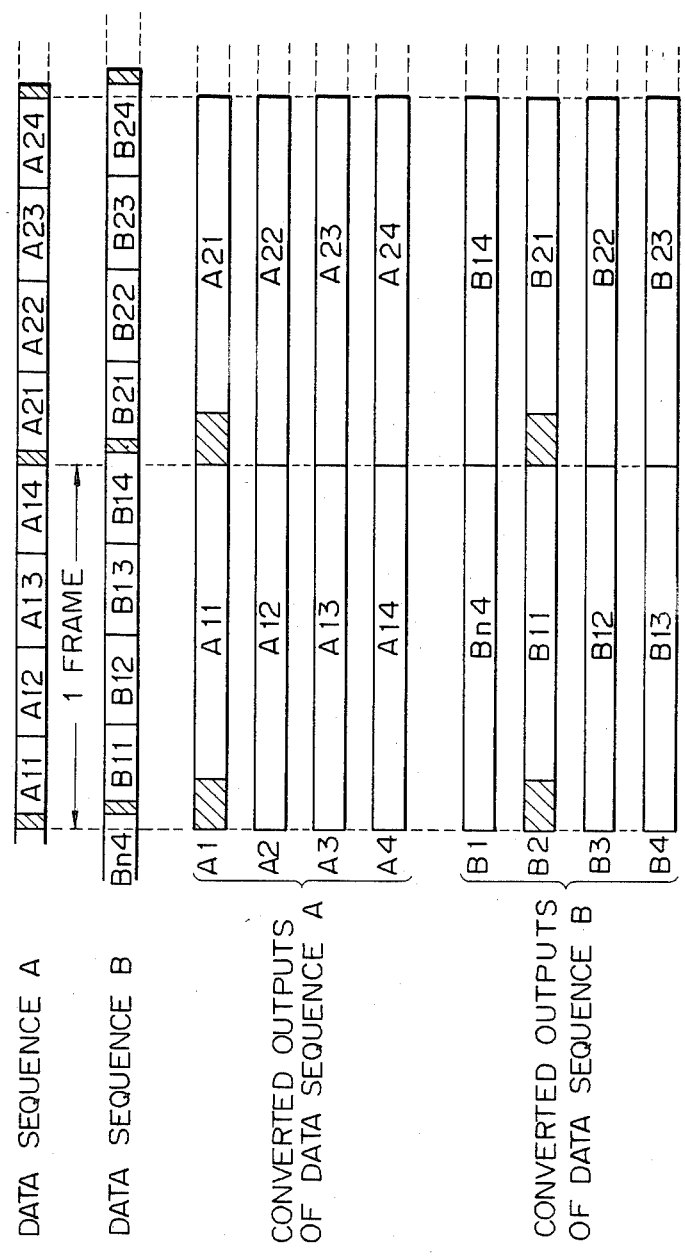

DEVICE FOR DETECTING BIT PHASE DIFFERENCE

BACKGROUND OF THE INVENTION

The present invention relates to a device for detecting a difference in bit phase between two identical data sequences each of which is transmitted through a different transmission path.

A device of the kind described is essential in many types of electronic devices which handle data. For example, in a digital microwave communications system having a regular channel and a backup channel, two identical data sequences (hereinafter referred to as data sequences A and B) which are individually transmitted in parallel over the regular and backup channels do not always coincide in bit phase with each other due to a difference in transmission delay between the two independent channels. Moreover, because the difference in transmission delay fluctuates with time, the deviation in bit phase between the data sequences A and B, too, fluctuates with time. Should the regular and backup channels be switched from one to the other while the bit phases are not coincident, a bit error would be caused at the time of switching. To eliminate such bit error, there are performed a sequence of steps: determining whether or not the data sequences A and B are matched in bit phase with each other; if they are not matched, forcibly shifting the relative bit phase until the data sequences become coincident; and thereafter switching from one channel to the other. This function is implemented with a device for detecting bit phase difference.

A prior art device for the detection of a bit phase difference includes a comparator for detecting a bit phase difference between the two data sequences A and B, by determining, whether or not the bit phases of the data sequences A and B are coincident. The prior art device further includes a decision circuit responsive to an output of the the comparator for deciding whether or not the data sequences A and B are matched in bit phase. Such prior art device, however, leaves the following problem unsolved. That is, when the data sequences A and B are each loaded with only a small amount of data, i.e., in a so-called light load condition, the number of data bits per predetermined number of bits of each of the data sequences A and B is decreased. This causes the decision circuit to malfunction and, therefore, to fail to accurately detect a bit phase difference.

SUMMARY OF THE INVENTION

It is, therefore, an object of the present invention to provide a bit phase difference detecting device capable of detecting a difference in bit phase between two identical data sequences, propagated through respective transmission paths, despite any reduction in the number of data bits per predetermined number of bits of each data sequence, even to zero.

It is another object of the present invention to provide a device for accurately detecting a bit phase difference.

The above and other objects, features and advantages of the present invention will become more apparent from the following detailed description taken with the accompanying drawings.

In accordance with the present invention, there is provided a device for detecting a difference in bit phase between two identical data sequences A and B each being transmitted over a respective one of two transmission path. The device includes a means for serial-to-parallel converting the data sequences A and B, respectively, into bit sequences $A_l$ to $A_m$ and $B_l$ to $B_m$ (M being a positive integer). The number of bits in each sequence is equal to a predetermined common measure of a frame period of the data sequences A and B. The device further includes a phase detecting means for detecting, respectively, phase differences between the bit sequences $A_l$ to $A_m$ and the bit sequences $B_l$ to $B_m$ which correspond to each other with respect to order. A bit difference between data sequences A and B is determined based on an output of the M bit phase detecting means.

BRIEF DESCRIPTION OF THE DRAWINGS

These objects as well as other objects of this invention shall become readily apparent after reading the following description of the accompanying drawings in which:

FIGS. 5A and 5B are timing charts representative of the conversion as performed by the S/P converters of FIG. 2;

DESCRIPTION OF THE PREFERRED EMBODIMENTS

Figure 1:
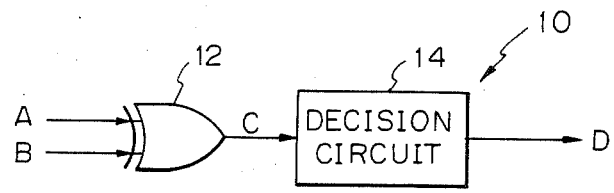
FIG. 1 is a block diagram showing a prior art device for detecting a bit phase difference.

To better understand the present invention, a brief reference will be made to a prior art bit phase difference detecting device, shown in FIG. 1. As shown, the prior art device, generally designated 10, includes a comparator 12 which is implemented with an Exclusive-OR (EX-OR) gate, and a decision circuit 14. While the comparator 12 receives data sequences A and B and produces a compare signal C, the decision circuit 14 receives the signal C and decides whether the data sequences A and B are coincident with each other in terms of bit phase. The EX-OR 12 produces a (logical) ZERO when the two inputs are coincident and a (logical) ONE when they are not coincident and, in this sense, compares the data sequences bit by bit to produce a result of decision. So long as the bit phases of the data sequences A and B are matched with each other, and so long as the data sequences A and B are free from transmission bit errors, the output C of the comparator 12 is a string of ZEROs only. However, the signal C sometimes becomes a ONE due to transmission bit errors.

Further, when the data sequences A and B are not coincident in bit phase, the signal C usually becomes a ONE with substantial probability. The decision circuit 14 counts the frequency of ZEROs and ONEs on line C during each predetermined period of time and decides whether or not the data sequences A and B are coincident. The result of this decision is produced as a decide signal D.

However, when the data sequences A and B are in a light load condition as previously stated and, therefore, there is hardly any bit change component, the probability that the compare signal C becomes a ONE when the bit phases are not coincident is decreased. For example, assuming that each of the data sequences A and B includes a single frame sync bit of ONE in one of its frame which is 2,928 bits long, and that all the other bits are ZEROs (except for transmission bit errors), the probability that the signal C becomes a ONE when the data sequences A and B are different in bit phase is as small as $2/2928$ which is nearly equal to $7 \times 10^{-4}$. In this instance, as the bit error rate (BER) of the data sequences A and B increases to the order of $7 \times 10^{-4}$, it is impossible to determine whether it is the non-coincidence of bit phases or the transmission bit error that made the signal C ONE. The prior art device 10, therefore, is frequently caused to malfunction.

Figure 2:
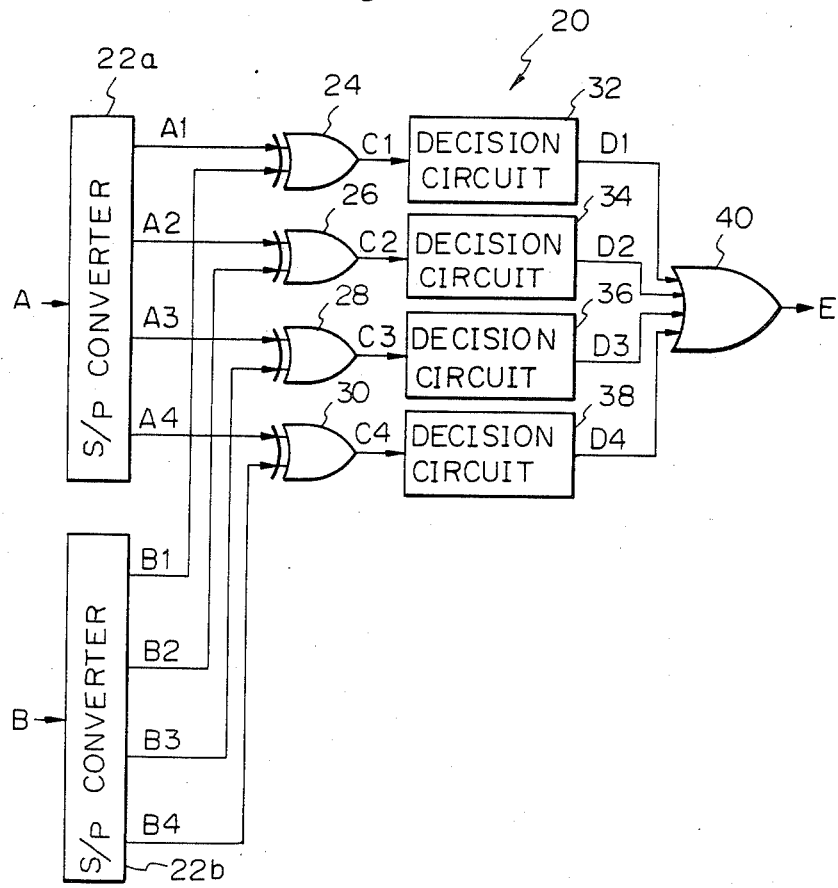
FIG. 2 is a block diagram showing a device for detecting a bit phase difference embodying the present invention.

Referring to FIG. 2 a bit phase different detecting device 20 embodying the present invention is shown which is free from the drawback discussed above. In the figure, the device 20 includes two S/P converters 22a and 22b to which are applied, respectively, identical data sequences A and B which are transmitted over independent transmission paths. In response, the S/P converters 22a and 22b produce a bit sequence $A_1$ to $A_4$ and a bit sequence $B_1$ to $B_4$, respectively. The bit sequences $A_1$ to $A_4$ and $B_1$ to $B_4$ are applied in pairs to four comparators 24, 26, 28 and 30 which are each implemented with, for example, an EX-OR gate. Compare signals $C_1$ to $C_4$ output by the bit phase comparators 24, 26, 28 and 30, respectively, are fed to four decision circuits 32, 34, 36 and 38, respectively. Further, decide signals $D_1$ to $D_4$ output by the foregoing decision circuits are fed to an OR gate 40 which is adapted to produce a decide signal E, the final result of detection.

Each of the S/P converters 22a and 22b functions to convert its associated data sequence A or B into a number of bit sequences which is equal to a predetermined common measure M (positive integer) of the frame period of the data sequences A and B. Hence, the S/P converters 22a and 22b each has a (1 to M) sequence converting function and may be implemented with a circuit construction which per se is well known in the art. In this particular embodiment, M is assumed to be 4. In detail, the S/P converters 22a and 22b divide, respectively, the data sequences A and B into four with respect to frequency to produce the bit sequences $A_1$ to $A_4$ and $B_1$ to $B_4$. By this conversion, the bit sequences $A_1$ to $A_4$ and $B_1$ to $B_4$ are each provided with a time slot which is four times longer than that of the original data sequences A and B. It follows that, assuming that each data sequence A or B includes 2,928 bits in one frame period, each of the bit sequences $A_1$ to $A_4$ and $B_1$ to $B_4$ includes 732 bits in one frame period, i. e. $2928/4=732$. The S/P converters 22a and 22b are operated in synchronism with each other such that the bits in the same time slots of the data sequences A and B are located in the same time slots of those of the bit sequences $A_1$ to $A_4$ and $B_1$ to $B_4$ which correspond to each other with respect to order.

Figure 3:
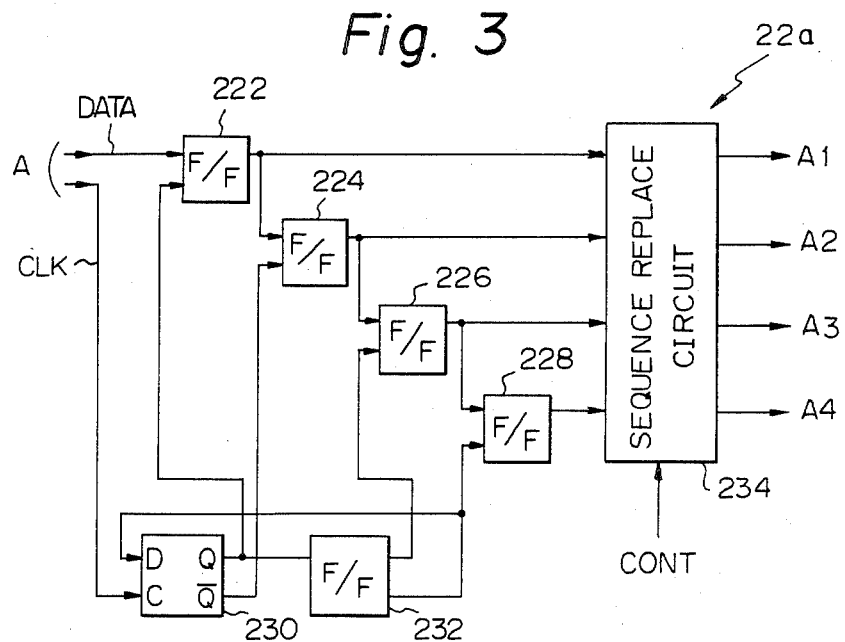
FIG. 3 is a block diagram showing a specific construction of a serial-to-parallel (S/P) converter as shown in FIG. 2.
Figures 4A, 4B:
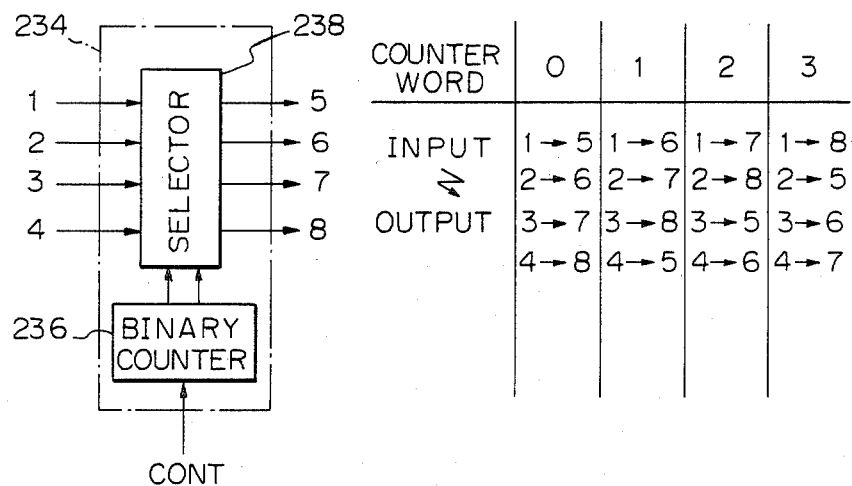
FIG. 4A is a block diagram showing a specific construction of a sequence replacing circuit as also shown in FIG. 3.
FIG. 4B is a table showing a relationship between inputs and outputs of the sequence replacing circuit of FIG. 4A.

Referring to FIG. 3, a specific construction of the S/P converter 22a is shown. Because the S/P converters 22a and 22b are substantially identical in construction, description of a specific construction for the S/P converter 22b is omitted. As shown, the S/P converter 22a is made up of four flip-flops (F/Fs) 222, 224, 226 and 228 which are supplied with a data sequence DATA to convert it into four bit sequences; F/Fs 230 and 232 for retiming in response to a quartered clock CLK; and a sequence replacing circuit 234 supplied with outputs of the four F/Fs 222, 224, 226 and 228, and also with a control signal CONT for replacing the sequences and, thereby producing the bit sequences $A_1$ to $A_4$. As shown in FIG. 4A, the sequence replacing circuit 234 comprises a binary counter 236 supplied with the control pulse signal CONT for converting it into a quaternary number, and a selector 238 to which an output of the binary counter 236 is applied. The inputs and outputs of the selector 238 are related with each other as shown in FIG. 4B.

Referring again to FIG. 2, the bit phase comparators 24, 26, 28 and 30 individually compare on a bit basis those of the bit sequences $A_1$ to $A_4$ and $B_1$ to $B_4$ which are the same in order, thereby producing the compare signals $C_1$ to $C_4$, respectively. If the data sequences A and B are coincident in bit phase, the bit sequences $A_1$ to $A_4$ and the bit sequences $B_1$ to $B_4$ which are the same in order with the bit sequences $A_1$ to $A_4$ coincide with each other even in terms of the bit phase, except for transmission bit errors. In this condition, all the compare signals $C_1$ to $C_4$ appear as a string of ZEROs except for transmission bit errors. On the other hand, if the data sequences A and B are not coincident in list pphase, those of the list sequences $A_1$ to $A_4$ and $B_1$ to $B_4$ which are the same in order do not agree with each other, resulting that the compare signals $C_1$ to $C_4$ become ONEs.

Receiving the compare signals $C_1$ to $C_4$, respectively, the decision circuits 32, 34, 36 and 38 decide whether or not those of the bit sequences $A_1$ to $A_4$ and $B_1$ to $B_4$ which share the same orders are coincident. These circuits 32 to 38 individually produce the decide signals $D_1$ to $D_4$, each of which is a ZERO if they are coincident and a ONE if they are not. When the data sequences A and B are coincident, all the decide signals $D_1$ to $D_4$ become a ZERO so that the final decide signal E output by the OR gate 40 becomes ZERO. When they are not coincident, at least two of the decide signals $D_1$ to $D_4$ become a ONE and, hence, the final decide signal E also becomes a ONE.

Referring to FIGS. 5A and 5B, there are shown timing charts which are representative of the (1 to 4) sequence convertion as performed by the S/P converters 22a and 22b. Specifically, FIG. 5A shows a case in which the data sequences A and B are coincident in bit phase and one frame period is converted into four bit sequences, i. e. M=4. In FIGS. 5A and 5B, frame sync pulses are indicated by hatching. As shown in FIG. 5A, four time slots A11, A12, A13 and A14 which constitute the first frame of the data sequence A are individually extended with respect to time axis to have the same period as the one frame period of the data sequence A. Consequently, the time slots A11, A12, A13 and A14 are converted into four parallel bit sequences A1, A2, A3 and A4, respectively. This is also true with the second frame and onward of the data sequence A and the data sequence B.

In FIG. 5B, a case wherein a phase difference corresponding to the frame sync pulse bit developed between the data sequences A and B is shown by way of example. In this condition, the four parallel data A1 to A4 associated with the data sequence A are exactly the same as those shown in FIG. 5A. However, as regards the data sequence B, $B_1$ is equal to $B_{n4}$, $B_2$ is equal to $B_{11}$, $B_3$ is equal to $B_{12}$, and $B_4$ is equal to $B_{13}$, i.e., the corresponding ones of the sequences which are derived from the data sequences A and B are each deviated by one time slot from each other.

Figure 6:
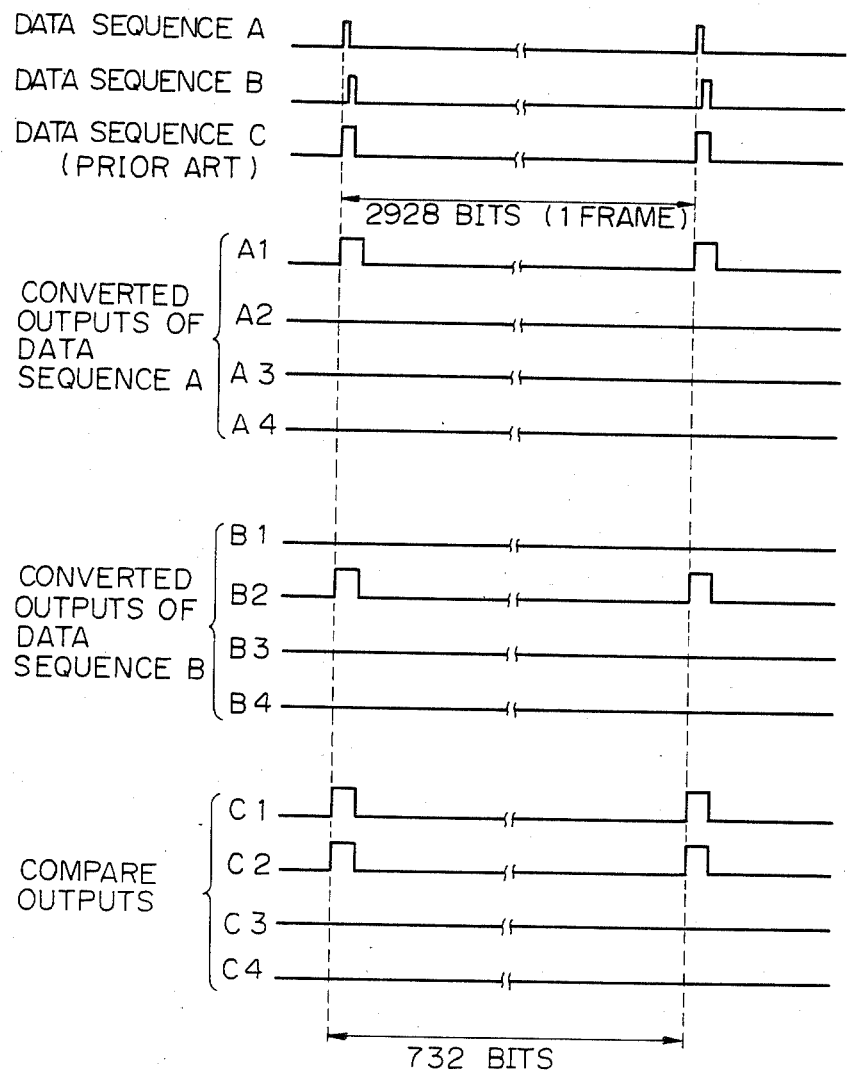
FIG. 6 is a timing chart demonstrating the operation of the S/P converters and that of comparators as shown in FIG. 2.

Taking account of the above occurrence, assume a condition wherein each of the data sequences A and B has a frame sync bit only (no load state) and is different in phase by one bit from each other, as represented by A and B in FIG. 6. In FIG. 6, the frame sync pulse is shown to comprise one bit to facilitate an understanding. The bit sequences produced by converting the data sequences A and B are represented by, respectively, A1 to A4 and B1 and B4 in FIG. 6. Further, EX-OR operations produced by the comparators 24, 26, 28 and 30 are respectively represented by $C_1$, $C_2$, $C_3$ and $C_4$ in FIG. 6. In this case, although the EX-ORs $C_3$ and $C_4$ become all-ZERO each indication bit-phase coincidence, EX-ORs $C_1$ and $C_2$ each includes a ONE indicating bit-phase non-coincidence.

Because the frame period is an integral multiple of the number of sequence conversions M (i.e., 4), the individual bits of the frames are necessarily converted into particular conversion output sequences on a frame-by-frame basis. In the example shown in FIG. 6, ONE in the outputs $C_1$ to $C_4$ of the comparators 24, 26, 28 and 30, respectively, appears only in the outputs $C_1$ and $C_2$ for every 732 bits, i.e. 2928/4=732.

By the above construction, phase differences between four data sequences are detected within one frame period, offering four times greater amount of phase difference information that is conventional. Especially in a no load condition, the frame bit appears in two sequences so that a twice greater amount of phase different information is achievable.

As described above, in the device 20 of this embodiment (FIG. 2), a bit phase difference is detected by the comparators on a 732-bit basis even in a no load condition. In contrast, as represented by a data sequence C in FIG. 6, the prior art device 10 discussed with reference to FIG. 1 cannot detect a bit phase difference except on 2928 bits at a time. Generally, when any bit error is developed on a transmission path, an incorrect result appears on the output of a bit phase comparator. In such a condition, while the prior art device 10 cannot detect a bit phase difference except for BERs of up to approximately $3 \times 10^{-4}$ (nearly equal to 1/2928), the device 20 in accordance with this embodiment is capable of detecting a bit phase difference up to BERs of approximately $1.4 \times 10^{-3}$, enhancing the reliability of detection.

Figure 7:
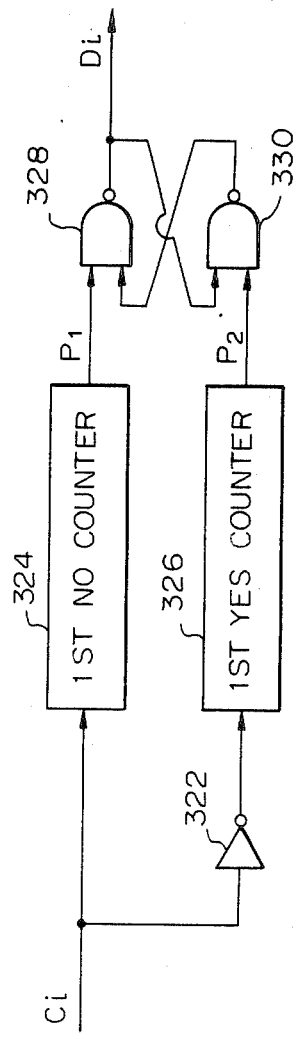
FIG. 7 is a block diagram showing a specific construction of a decision circuit as shown in FIG. 2.

Referring to FIG. 7, a specific construction of the bit phase decision circuit which is applicable to the device as shown in FIG. 2 is shown. In the following description, M is assumed to be 16, i.e. Ci ranges from $C_1$ to $C_{16}$ and Di ranges from $D_1$ to $D_{16}$.

In FIG. 7, a decision circuit comprises a NOT gate 322 to which a compare signal Ci is applied; a first NO counter 324 responsive to the compare signal Ci for producing a pulse $P_1$; a first YES counter responsive to an output of the NOT gate 322 for producing a pulse $P_2$; and NAND gates 328 and 330. The NAND gate 328 produces a decide signal Di in response to the pulse $P_1$ and the output of the NAND gate 330. The NAND gate 330 is supplied with the pulse $P_2$ and an output of the NAND gate 328.

The first NO counter 324 counts the occurrences that the compare signal Ci becomes a ONE (on the basis of the time slot of the bit sequences Ai and Bi) every five-frame period (i.e., every $183 \times 5$ bits of the bit sequences Ai and Bi), and produces the negative pulse $P_1$ every time the count reaches 4. On the other hand, the first YES counter 326 counts the occurrences that the output signal of the NOT gate 322 becomes a ONE (i.e. the compare signal Ci becomes a ZERO) every sixteen bits of the bit sequences Ai and Bi, and produces the negative pulse $P_2$ every time the count reaches 12. The NAND gates 328 and 330 are so interconnected as to constitute an R-S F/F which is set by the pulse $P_1$ and reset by the pulse $P_2$, so that the decide signal Di becomes a ONE in response to the pulse $P_1$ and a ZERO in response to the pulse $P_2$.

If the transmission bit error of the bit sequences Ai and Bi is negligible, the compare signal Ci becomes all-ZERO so long as the bit sequences Ai and Bi are coincident. In this condition, the pulse $P_1$ is not produced and, instead, the pulse $P_2$ is produced to make the decide signal $D_i$ ZERO. Conversely, if the bit sequences Ai and Bi are not coincident in bit phase and the compare signal Ci becomes a ONE at least once within one frame period, the pulse $P_1$ appears once for very five frame periods and the decide signal Di also becomes a ONE. Considering the fact that even if the bit sequences Ai and Bi are not identical the pulse $P_2$ sometimes appears after the pulse $P_2$ has appeared, the decide signal Di remains ZERO until the appearance of the next pulse $P_1$.

Figure 8:
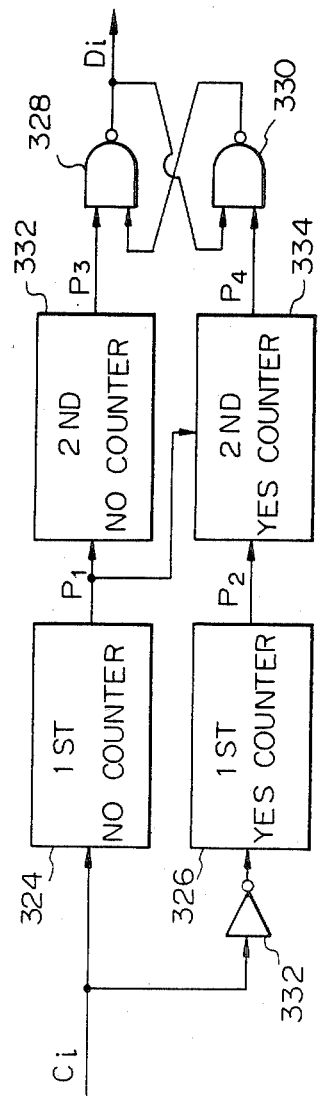
FIG. 8 is a block diagram showing an alternative construction of the decision circuit.

FIG. 8 shows another specific construction of the decision circuit. This embodiment is essentially similar to that of FIG. 7 except for the addition of a second NO counter 332 and a second YES counter 334. The second NO counter 332 receives the pulse $P_1$ and applies a pulse $P_3$ to the NAND gate 328. The second YES counter 334 receives the pulses $P_1$ and $P_2$ and applies a pulse $P_4$ to the NAND gate 330. The operation of the circuit shown in FIG. 8 will be described on the assumption that the two bit sequences from which the compare signal Ci is derived have frames each comprising 183 bits and, if the bit sequences do not agree with each other, the compare signal Ci becomes a ONE at least once in one frame period, as has been assumed for the embodiment of FIG. 7.

The second NO counter 332 counts the occurrences that the pulse $P_1$ appears every $5 \times 16$ frame period and, each time the count reaches 14, produces the negative pulse $P_3$. The second YES counter 334, on the other hand, counts the arrivals of the pulse $P_2$ and, when the count reaches 92, produces the negative pulse $P_4$ while being cleared (the count being reduced to zero) upon arrival of the pulse $P_1$. As stated earlier the period for which the first NO counter 324 continues counting is five consecutive frames, and the maximum number of pulses $P_2$ which may appear during such an interval is $5 \times 183/16$, which is smaller than 58. The threshold count of the second YES counter 334 is selected to be 92, which is greater than 58.

Assuming that the error of the compare signal Ci with respect to probability is negligible, so long as the bit sequences from which the compare signal Ci is obtained are coincident, the pulse $P_1$ and, therefore, the pulse $P_3$ does not appear. At this instant, because the pulse $P_2$ appears every sixteen bits and the pulse $P_4$ appears every 16×92 bits (about eight frames), the decide signal Di becomes a ZERO and never becomes a ONE. Conversely, when the bit sequences are not non-coincident, the pulse $P_1$ appears every five frames and, therefore, sixteen times in 5×16 frames the pulse $P_3$ is consequently produced to change the decide signal Di to a ONE. At the same time, each pulse $P_1$ clears the second YES counter 334 and, because the maximum number of pulses $P_2$ which may appear before the appearance of the next pulse $P_1$ is less than 58 and smaller than 92, no pulse $P_4$ appears. Hence, if the bit sequences are different in bit phase, the decide signal Di remains a ONE.

As the error rate of the compare signal Ci increases to the order of $5.5 \times 10^{-3}$, the pulse $P_1$ appears even if the bit sequences are coincident. Nevertheless, the probability that the pulse $P_3$ appears in response to the erroneous appearance of the pulse $P_1$ is low and, at the same time, the probability of an erroneous appearance of the pulse $P_3$ sharply decreases with decreasing probability of an erroneous appearance of the pulse $P_1$. It follows that even a slight decrease in the error rate of the compare signal Ci to lower than $5.5 \times 10^{-3}$ serves to reduce the probability of erroneous generation of the pulse $P_3$ and, therefore, to significantly reduce the probability of erroneous change of the decide signal Di to a ONE.

As described above, in accordance with this embodiment, the non-coincidence of two bit sequences can be detected even in a light load condition, i. e., even if the compare signal Ci becomes a ONE only once in one frame (183 bits). In addition, the probability that coincidence is erroneously decided to be non-coincidence is negligibly low until the error rate of the compare signal Ci increases up to substantially $5.5 \times 10^{-3}$.

If desired, an arrangement may be made such that upon the appearance of the pulse $P_2$ the first YES counter 326 is cleared to start on the next counting immediately. This would shorten the period of time necessary for decision. In such a case, too, it is a prerequisite that the maximum number 5×183/12 (77) of pulses $P_2$ which may appear during the counting time (5×183 bits) of the first NO counter 324 be smaller than the threshold count (92) of the second YES counter 334. Further, the second NO counter 332 may be cleared by the pulse $P_4$ to cause the second NO counter 332 to start counting always from "0", thereby enhancing the certainty of pulse $P_3$.

In summary, it will be seen that the present invention provides a bit error difference detecting device which is capable of accurately determining a phase difference between a pair of data sequences respectively transmitted over separate transmission paths, even when such paths are lightly loaded. At the same time, the bit error detecting device of the invention improves the accuracy of determining the phase difference between two data sequences under a degraded path condition.

Although the present invention has been described in connection with a preferrred embodiment thereof, many other variations and modifications will now become apparent to those skilled in the art. It is preferred, therefore, that the present invention be limited not by the specific disclosure herein, but only by the appended claims.

What is claimed is:

1. A device for detecting a difference in bit phase between two identical data sequences A and B each being transmitted over a respective one of two transmission paths, comprising:
   means for serial-to-parallel converting the data sequences A and B into respective bit sequences $A_l$ to $A_m$ and $B_l$ to $B_m$ where M is a positive integer equal to a predetermined common measure of a frame period of the data sequences A and B;
   M bit phase detecting means for detecting respective phase differences between corresponding ones of the bit sequences $A_l$ to $A_m$ and $B_l$ to $B_m$, such corresponding being with respect to order; and
   means to determine the bit phase difference between the data sequences A and B responsive to respective outputs from said M bit phase detecting means.

2. A device as claimed in claim 1, wherein said bit phase detecting means comprise:
   M bit phase comparators for individually comparing the bit phase for each pair of corresponding bits of the bit sequences $A_l$ to $A_m$ and $B_l$ to $B_m$ and for producing respective compare signals $C_l$ to $C_m$; and
   M decision circuits respectively responsive to the compared signals $C_l$ to $C_m$ for deciding the presence or absence of coincidence in bit phase of the corresponding bits of the bit sequences $A_l$ to $A_m$ and $B_l$ to $B_m$ and producing M decide signals $D_l$ to $D_m$.

3. A device as claimed in claim 2, wherein said M bit phase comparators each comprises an Exclusive-OR gate.

4. A device as claimed in claim 2, wherein said decision circuits each comprise:
   a first NO counter responsive to any of the compare signals $C_l$ to $C_m$ for producing a first pulse;
   a NOT gate responsive to the same compare signal;
   a first YES counter responsive to an output signal of said NOT gate for producing a second pulse; and
   a pair of NAND gates responsive to the first and second pulses, respectively, for producing a respective decide signal $D_l$ to $D_m$.

5. A device as claimed in claim 2, wherein each of said decision circuits comprise:
   a first NO counter responsive to any of the compare signals $C_l$ to $C_m$ for producing a first pulse;
   a NOT gate responsive to the same compare signal;
   a first YES counter responsive to an output signal of said NOT gate for producing a second pulse;
   a pair of NAND gates responsive to the first and second pulses, respectively, for producing a respective decide signal $D_l$ to $D_m$;
   a second NO counter responsive to the first pulse output by said first NO counter for producing a third pulse; and
   a second YES counter responsive to the first and the second pulses output by said first YES counter for producing a fourth pulse;
   the third and fourth pulses being applied to said NAND gates.

6. A device as claimed in claim 2, wherein said bit phase detecting means further comprise an OR gate for producing a final decide signal in response tot he M decide signals $D_l$ to $D_m$ output by said decision circuits.

* * * * *